United States Patent [19]
Beffa et al.

[11] Patent Number: 5,910,921
[45] Date of Patent: Jun. 8, 1999

[54] SELF-TEST OF A MEMORY DEVICE

[75] Inventors: Ray J. Beffa; William K. Waller; Eugene H. Cloud, all of Boise; Warren M. Farnworth, Nampo; Leland R. Nevill, Boise, all of Id.

[73] Assignee: Micron Technology, Inc., Boise, Id.

[21] Appl. No.: 08/838,010

[22] Filed: Apr. 22, 1997

[51] Int. Cl.[6] ................................................. G11C 13/00
[52] U.S. Cl. ........................................... 365/201; 365/200
[58] Field of Search ..................................... 365/200, 201

[56]  References Cited

U.S. PATENT DOCUMENTS

| | | | |
|---|---|---|---|
| 5,668,763 | 9/1997 | Fujioka et al. | 365/200 |
| 5,751,647 | 5/1998 | O'Toole | 365/200 |
| 5,754,484 | 5/1998 | Perreault | 365/200 |
| 5,757,716 | 5/1998 | Lee | 365/200 |
| 5,761,138 | 6/1998 | Lee et al. | 365/200 |

*Primary Examiner*—Terrell W. Fears
*Attorney, Agent, or Firm*—Dickstein Shapiro Morin & Oshinsky LLP

[57]  ABSTRACT

DRAM self-test circuitry, when triggered by an external signal, performs an on-chip test of a DRAM memory array. The self-test circuitry writes either all ones or all zeroes to each set of physical rows having the same address within the segment to be tested, and then reads the rows a set at a time. If the data bits comprising the set do not all equal one or zero, a resultant error detection signal is generated and used to latch the failed addresses into a failed address queue. If the data bits are either all zeros or ones, the next set of rows are tested. When the self-test is complete, the failed addresses stored in the queue may be transmitted to an external, off-chip device or analyzed and acted on by on-chip error correction circuitry. The self-test circuitry further includes circuitry to detect data bit transitions between successive failing addresses latched in a the address queue. If the transition circuitry determines that one or more bits have the same logic in all of the failed addresses, a partialing technique may be employed to repair DRAMs that have more failing rows/columns than redundant rows/columns.

31 Claims, 11 Drawing Sheets

SELF-TEST OF A MEMORY DEVICE

RELATED APPLICATIONS

This disclosure is related to the application entitled "Apparatus and Method Implementing Repairs on a Memory Device," invented by Ray Beffa, William Waller, Warren Farnworth, Leland Nevill, and Eugene Cloud, filed on Apr. 22, 1997, the contents of which are hereby incorporated by reference.

BACKGROUND OF THE INVENTION

The present disclosure relates generally to the computer memory field, and more particularly, to on-chip testing of dynamic random access memory (DRAM) semiconductor chips.

A DRAM memory cell (memory bit) is a binary memory element formed with one transistor and one capacitor. A modem DRAM memory unit may contain many millions of addressable memory cells. Each cell's capacitor holds binary information in the form of charge, and the cell's transistor operates as a switch to introduce and control the charge stored on the capacitor.

The memory cells are organized into arrays. To access a particular memory cell when performing a read operation, the operator supplies the DRAM with the address of the cell to be accessed. The DRAM translates the address into a row address and a column address of the array the memory cell is located in, and the addressed column and row are then accessed and the charge stored on the memory cell capacitor at the intersection of the addressed column and row is sensed.

FIG. 1 is a diagram showing a memory cell array map for a 4 Meg×4 DRAM (i.e., a DRAM with sixteen million total bits, accessible in four million, four-bit units). Array maps for other size DRAMs are similar in content. The DRAM is divided into four quadrants, each made up of a series of rows, such as row 106, and columns, such as column 107. The rows in quadrants one and three have addresses extending from zero to 1023, and are accessed four at a time. That is, because each row address in a quadrant is repeated four times, access to any row address drives four physical rows in the accessed quadrant. Each column in a quadrant, such as quadrant three, intersects all four active rows. The column addresses in quadrants one and three extend from zero to 2047. The addressing scheme is similar for quadrants two and four. For each bit that is eventually output by the DRAM, the active column and the active physical rows access four bits in a quadrant. Additional circuitry on the DRAM selects certain of the four accessed bits and places them on the appropriate output data pin(s). In this example, two bits are selected from the physical rows accessed in quadrant three, corresponding to output DQs 2 and 3, and two bits are selected from the physical rows accessed in quadrant one, corresponding to output DQs 1 and 4.

Before shipping a DRAM semiconductor chip, it must be tested to ensure that all the memory cells function properly. One conventional method of testing a DRAM is to have an external testing device store data in every memory cell in the DRAM, and then read out every memory cell in the DRAM. In this manner, DRAM defects can be detected by comparing the known input data to the output data. However, as DRAMs increase in capacity, accessing all the memory cells begins to take an inordinate amount of time. For example, in the case of a 4 Meg×4 DRAM, conventional testing techniques would require four million write cycles and four million read cycles to fully test the DRAM one time.

A second conventional method decreases testing time by taking advantage of the fact that multiple bits are sensed when a row address is accessed in a quadrant. In this method, circuitry is placed on the DRAM chip, which operates on multiple data bits sensed for each row address. The circuitry transmits a logic one if all the sensed data bits are a logic one, a logic zero if all the sensed data bits are a logic zero, and enters a high impedance state if the data bits are mixed, i.e., both logic ones and zeros.

To perform a DRAM test with the second conventional method, the external testing unit, for each column address, writes either all ones or all zeroes to each row address to be tested, and then performs a read operation on the addresses. For each address read by the testing unit, the internal DRAM test circuitry outputs a one, zero, or high impedance state, thus informing the testing unit whether any of the bits sensed in the row address are bad. By testing a plurality of data bits simultaneously, testing time is reduced.

A goal of both of the above described conventional testing techniques is to replace defective addresses when found. One way to do this is to fabricate the DRAM memory arrays with extra rows and columns of cells, which can be substituted for rows or columns of cells found to be defective. Essentially, when a defective row or column is found, fuses are blown, isolating the defective row or column and mapping the redundant row or column to the address previously occupied by the defective row or column. In this manner, a memory array with a limited number of defective elements can be completely repaired. Two types of fuses are commonly used in the repair of DRAMs: laser fuses and electrical fuses. The laser fuse is typically a polysilicon conductor that becomes an open circuit when blown by an externally applied laser beam while the memory die is in wafer form. The electrical fuse is in the form of a capacitor whose plates are short circuited together upon application of a high voltage. The electrical fuse may be activated by repair circuitry internal to the DRAM, even when the DRAM is fully packaged.

The above-described conventional testing and repair techniques require a sophisticated external testing unit, which spends a significant amount of time testing each DRAM. As DRAM sizes increase, the amount of required testing time proportionality increases. For high volume DRAM manufacture, testing time may become unacceptably long.

There is, therefore, a need to reduce the amount of time each DRAM is connected to a testing unit. Additionally, it is desirable to decrease the complexity and expense of external testing units.

SUMMARY OF THE INVENTION

DRAM self-test circuitry performs a self-test of the DRAM memory cells, and stores the addresses of failed cells in an on-chip address queue. The failed cell addresses may later be retrieved from the chip and analyzed by an external tester, which may then repair the failed cells. Alternatively, additional on-chip circuitry may analyze and repair the failed cells. In either repair scheme, significant time is saved because the DRAM can perform a complete internal self-test without requiring extensive supervision by an external testing unit.

The advantages and purposes in accordance with this invention will be set forth in the following description and will also be obvious from the description, or may be learned by practicing the invention. The advantages and purpose of the invention will be realized and attained by means of the elements and combinations particularly pointed out in the appended claims.

To obtain the advantages, and in accordance with the purpose of the invention, as embodied and broadly described herein, the present invention is in the form of a DRAM comprising a failed cell address queue and an error detection circuit. The error detection circuit is configured to receive a plurality of bits from the memory array and transmit an error detection signal to the failed cell address queue. The error detection signal is based on the logical value of a plurality of bits, such that the error detection signal indicates an error when the plurality of bits do not all have the same logical value. In response to the error detection signal, the failing address is then stored in the failed cell address queue.

Both the foregoing general description and the following detailed description are exemplary and explanatory only and do not restrict the invention, as claimed.

BRIEF DESCRIPTION OF THE DRAWINGS

The accompanying drawings, which are incorporated in and constitute a part of this specification, illustrate several embodiments of the invention and, together with the description, serve to explain the principles of the invention. In the drawings.

DETAILED DESCRIPTION

Reference will now be made in detail to the embodiments of the invention, examples of which are illustrated in the accompanying drawings. Wherever possible, the same reference numbers will be used throughout the drawings to refer to the same or like parts.

This invention includes self-test circuitry that, when triggered by an external signal, performs an on-chip test of a DRAM memory array. The self-test circuitry, for each column address, writes either all ones or all zeroes to each set of physical rows having the same address within the segment to be tested, and then reads the rows a set at a time. If the data bits comprising the set do not all equal one or zero, a resultant error detect signal is generated and used to latch the failing address into a failed cell address queue. If the data bits are good, that is, no error is detected, the next set of rows is sensed. When the self-test is complete, the failed cell addresses may be transmitted to an external, off-chip device or analyzed and acted on by on-chip error correction circuitry.

Further, in another embodiment, the self-test circuitry includes circuitry to detect transitions between successive failed cell addresses latched in the address queue. If the transition circuitry determines that one or more bits have the same logic in all of the failing addresses, a partialing technique may be employed to repair those DRAMs that have more failed rows/columns than redundant rows/columns by isolating blocks of memory cells including defective cells.

DRAM WITH SELF-TEST CAPABILITY

Figure 2:
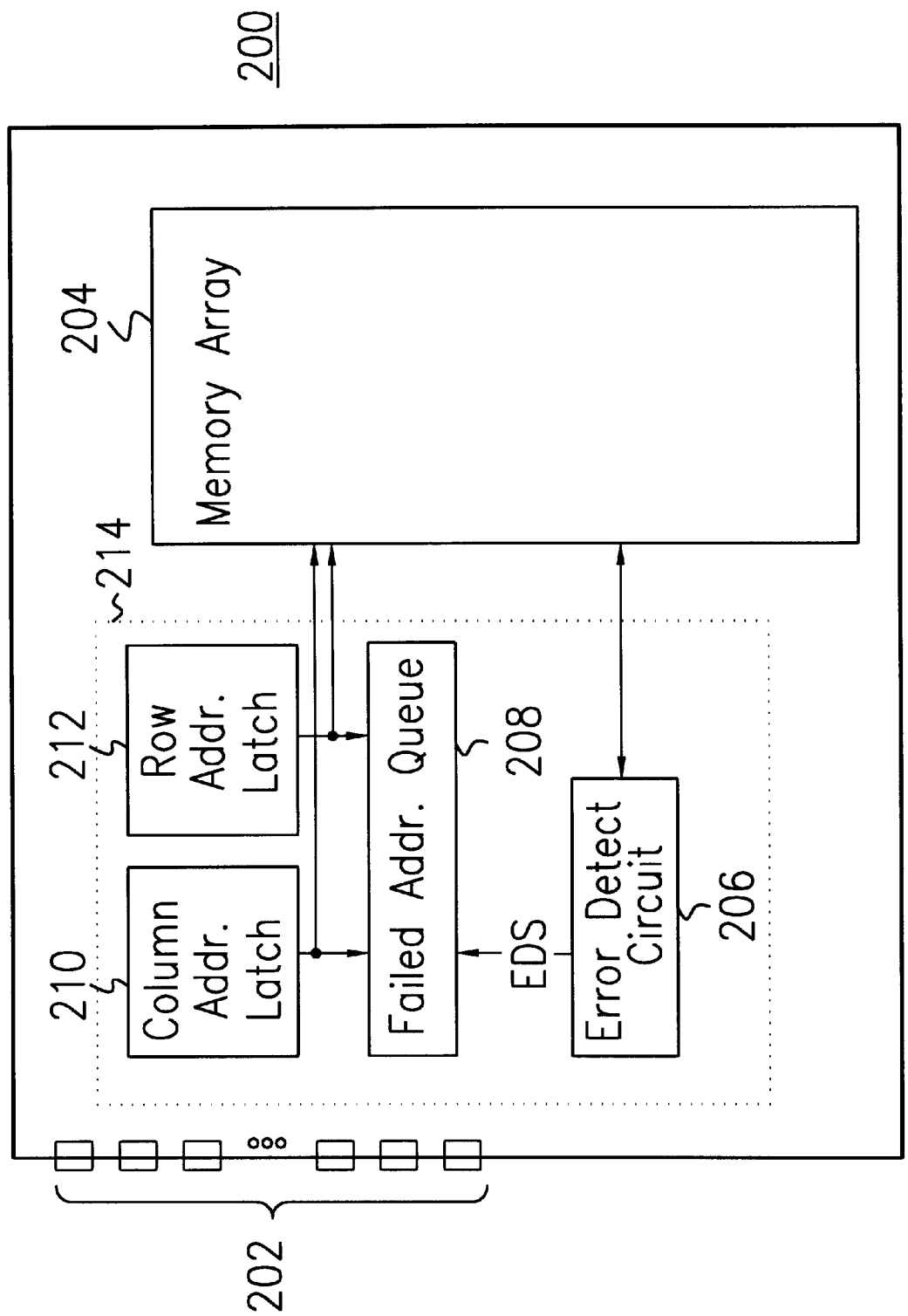
FIG. 2 is a conceptual block diagram illustrating a DRAM with a self-test capability according to the present invention.

A DRAM, equipped with a self-test capability according to one embodiment of the present invention, seen in FIG. 2, is preferably implemented on semiconductor chip 200, which includes a plurality of pins 202, such as data I/O pins, address pins, and various control pins, for interfacing chip 200 with the outside world.

Figure 1:
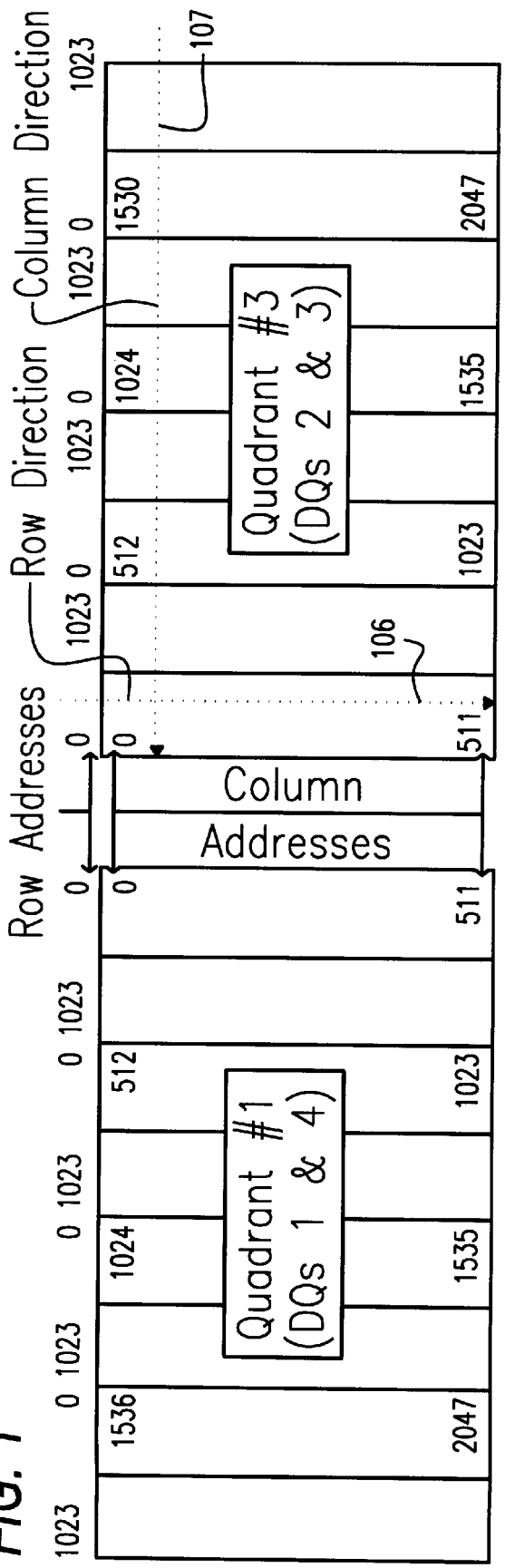
FIG. 1 is a diagram showing a memory cell array map for a 4 Meg×4 DRAM.
Figure 1:
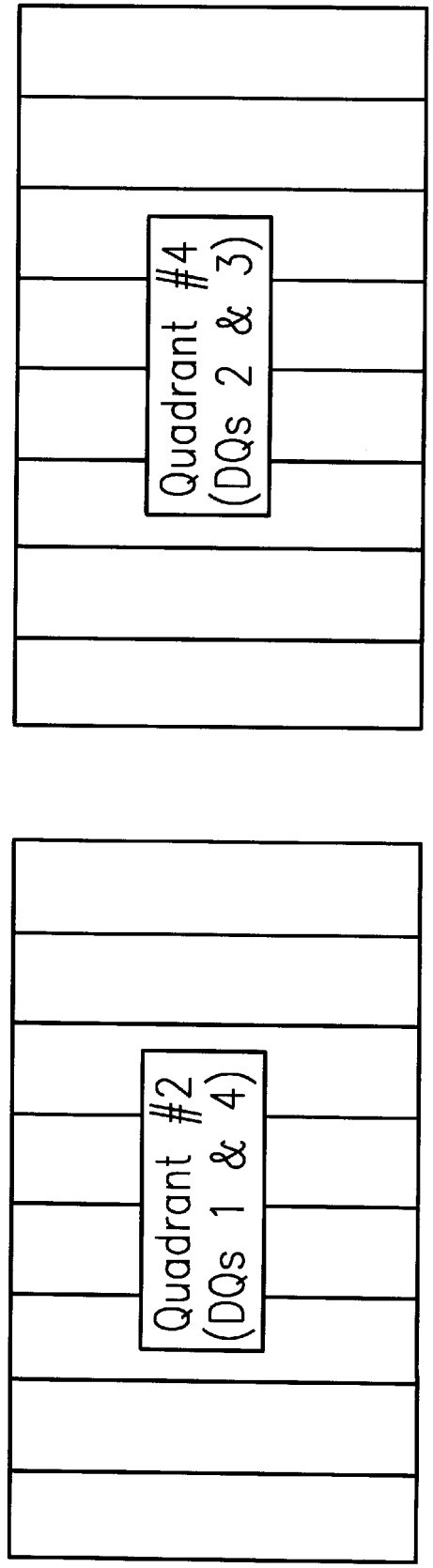

Memory array 204, which may be subdivided into quadrants as shown in FIG. 1, includes memory cells that store data. Self-test circuitry 214 includes error detection circuitry 206 and failed address queue 208, both described below in further detail. Column address latch 210 and row address latch 212 store the to-be-accessed column and row addresses. Semiconductor chip 200 and self-test circuitry 214 include additional control circuitry (not shown) for interfacing/decoding data and commands with memory array 204. Such control circuitry is well known in the art and will not be described further.

During normal DRAM operation, to access data, the operator supplies DRAM 200 with row and column addresses. The row and column addresses are stored in the row address latch 212 and column address latch 210, respectively, and are used to access data stored in memory array 204. The row address turns on multiple physical rows having the same address within a segment (e.g., four rows are turned on in a 4 Meg×4 DRAM). The column address determines which one of the data bits sensed on the activated rows should be sent to a DRAM output pin.

Self-test circuitry 214, in response to a command from an external testing unit (not shown), writes either all ones or all zeroes to each set of the physical rows having the same row and column address within the segment to be tested, and then reads the rows a set at a time. The particular pattern of groups of ones and zeroes to be written to the memory array 204 is predetermined and preferably hardwired into self-test circuitry 214.

Preferably, self-test circuitry 214 uses a internal CAS before RAS (CBR) counter, which is the counter normally used in the DRAM refresh cycle to generate the addresses to be accessed. Alternatively, self-test circuitry 214 may use dedicated counters to index through column and row addresses.

Error detect circuit 206 receives the data bits from the physical rows having the same row and column addresses within a segment and generates an error detect signal (EDS) which is received by the failed address queue 208. The error detect signal indicates whether the data bits in a set are good, that is, error free, or whether an error is present. If an error is detected, the failed address corresponding to the set of erroneous memory elements is latched from the column address latch 210 and row address latch 212 to the failed address queue 208.

If all of the bits in the set input to error detect circuit 206 fail, the generated error detect signal EDS may be inaccurate. However, because the probability that all the bits will fail is statistically insignificant, this possibility is not a practical problem.

Figure 3A:
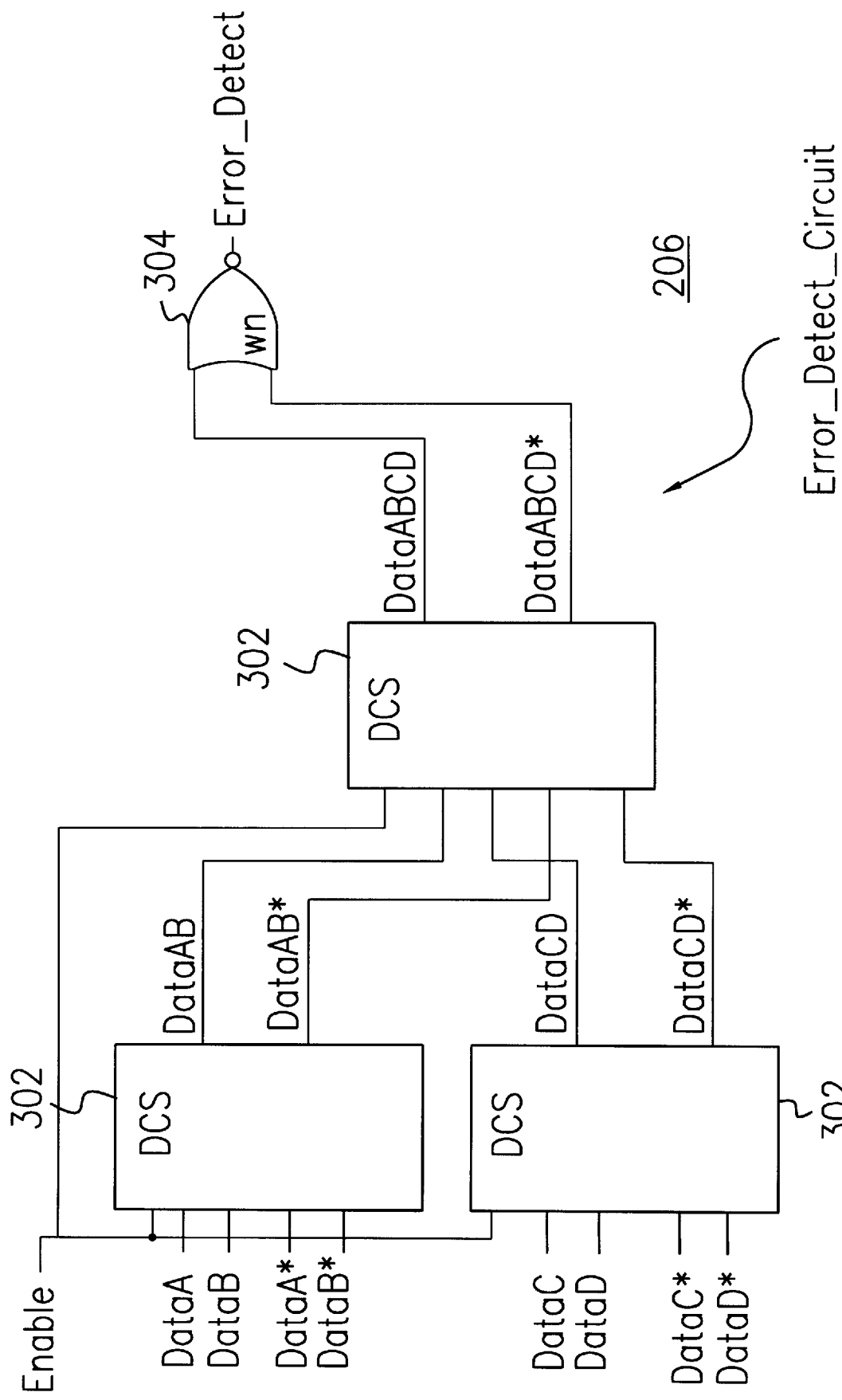
FIGS. 3A and 3B are diagrams illustrating a preferred embodiment of an error detection circuit according to the present invention.
Figure 3B:
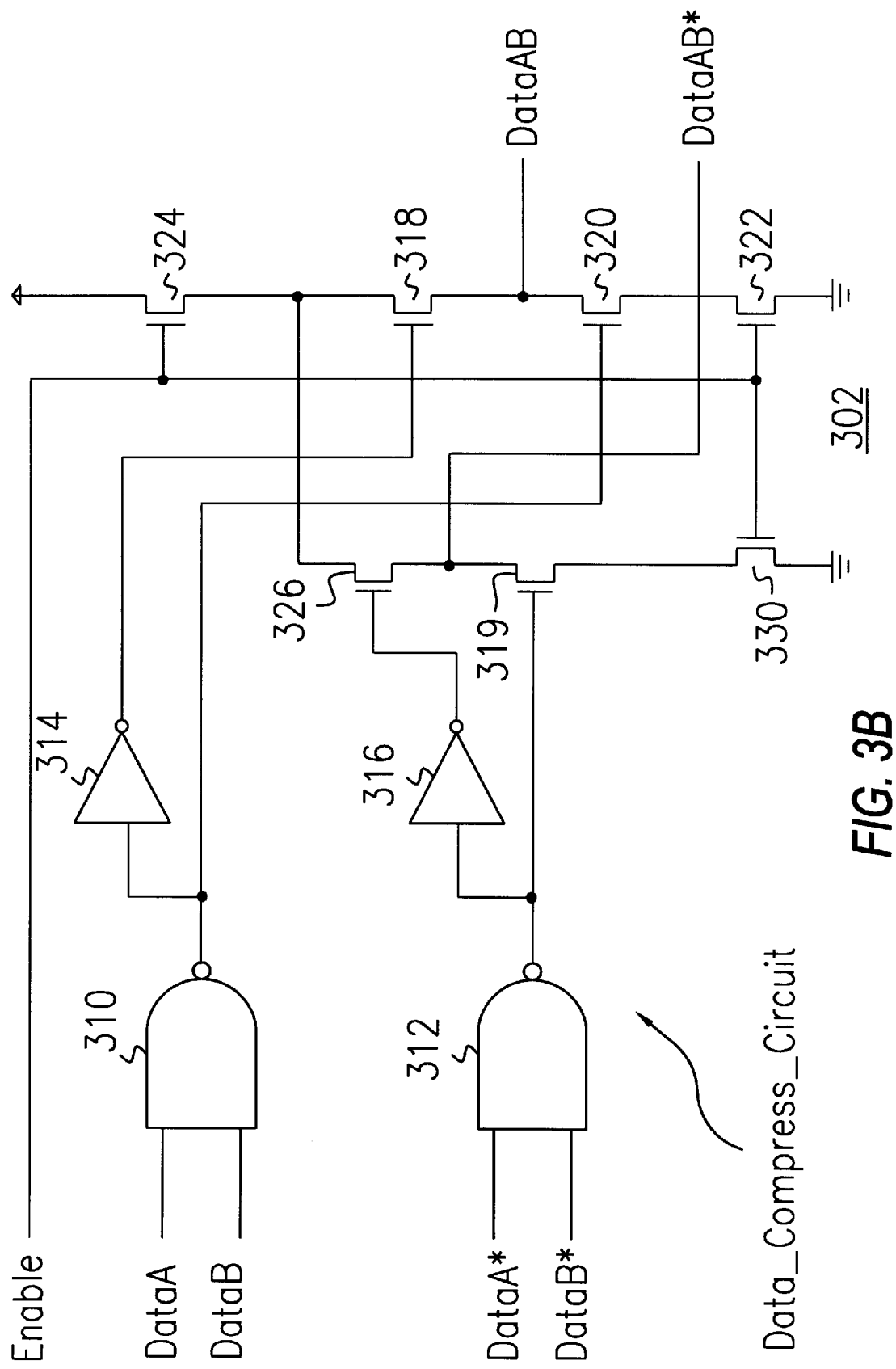

FIGS. 3A and 3B are diagrams illustrating a preferred embodiment of error detection circuit 206. In FIGS. 3A and 3B, DataA, DataB, DataC, and DataD each represent one of the four data bits in a set having the same address within the segment to be tested. Signals followed by a "*" denote logical complements.

Error detect circuit 206 comprises three data compress circuits 302 and a NOR gate 304. Two of the three data compress circuits 302 receive DataA through DataD and their respective complements. The third data compress circuit 302 receives as inputs the outputs of the first two data compress circuits, labeled as DataAB, DataAB*, DataCD, and DataCD*. The outputs of the third data compress circuit are gated through NOR gate 304, which generates the error detect signal. The enable signal, when applied to error detect circuit 206, floats the output of the error detect circuit.

The truth table for error detect circuit 206 is shown in Table I.

TABLE 1

| Input | | | | Output | Data- | Error- |
| DataA | DataB | DataC | DataD | DataABCD | ABCD* | Detect |
|---|---|---|---|---|---|---|
| 0 | 0 | 0 | 0 | 0 | 1 | 0 |
| 0 | 0 | 0 | 1 | 0 | 0 | 1 |
| 0 | 0 | 1 | 0 | 0 | 0 | 1 |
| 0 | 0 | 1 | 1 | 0 | 0 | 1 |
| 0 | 1 | 0 | 0 | 0 | 0 | 1 |
| 0 | 1 | 0 | 1 | 0 | 0 | 1 |
| 1 | 1 | 1 | 1 | 0 | 0 | 1 |
| 1 | 0 | 0 | 0 | 0 | 0 | 1 |
| 1 | 0 | 0 | 1 | 0 | 0 | 1 |
| 1 | 0 | 1 | 0 | 0 | 0 | 1 |
| 1 | 0 | 1 | 1 | 0 | 0 | 1 |
| 1 | 1 | 0 | 0 | 0 | 0 | 1 |
| 1 | 1 | 0 | 1 | 0 | 0 | 1 |
| 1 | 1 | 1 | 1 | 1 | 0 | 0 |

FIG. 3B is a detailed circuit diagram of a typical implementation of each data compress circuit 2, which is seen to include a pair of NAND gates 310 and 312, connected to the input lines. The outputs of NAND gates 310 and 312 are fed through inverter circuits 314 and 316, to control the gates of FETs 318 and 326, respectively. The outputs of NAND gates 310 and 312 are also directly applied to control the gates of n-channel FETs 320 and 319, respectively. N-channel FETs 322, 324, and 330 are controlled by an enable input on line Enable. When the Enable line is low, FETs 322, 324, and 330 are turned off, thus floating the outputs Data AB and Data AB* of data compress circuit 302.

The truth table for this data compress circuit 302 is shown in Table II.

TABLE II

| Input | | Output | |
| DataA | DataB | DataAB | Data AB* |
|---|---|---|---|
| 0 | 0 | 0 | 1 |
| 0 | 1 | 0 | 0 |
| 1 | 0 | 0 | 0 |
| 1 | 1 | 1 | 0 |

Figure 4:
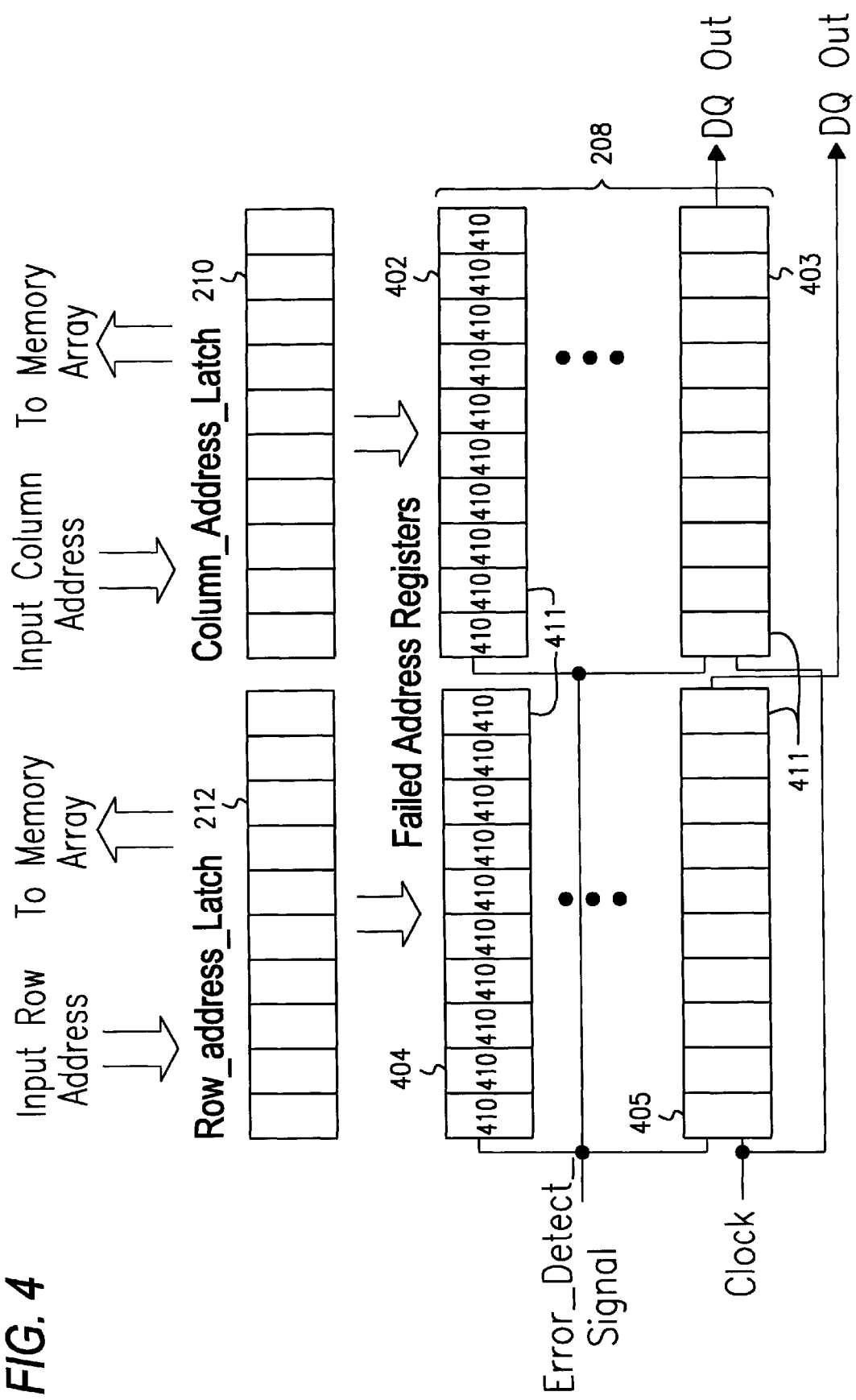
FIG. 4 is a diagram illustrating a first embodiment of a failed cell address queue according to a first embodiment of the present invention.

FIG. 4 is a diagram illustrating a first embodiment of a failed address queue 208 consistent with the present invention. Failed address queue 208 operates as a First-In-First-Out (FIFO) queue and typically comprises two or more failed address registers 411, each made up of a column failed address register 402 and a row failed address register 404. Registers 402 and 404 store address data from column address latch 210 and row address latch 212, respectively. Each failed address register 411 preferably comprises a series of delay latches 410. Each delay latch 410 stores one data bit, which is forwarded to the corresponding delay latch 410 in the next failed address register 411, when the error detect signal is active.

During operation, addresses stored in row address latch 212 and column address latch 210 are used access memory array 204, and the data bits stored at the addressed array locations are sensed and input to the error detect circuit 206. The resultant error detect signal is supplied to control failed address registers 402 and 404. When the error detect signal indicates an error (i.e., a logic high), the row and column addresses in row address latch 212 and column address latch 210 are received by the first failed address register 411 in queue 208. Simultaneously, the failed column and row addresses previously stored in failed address queue 208 are transmitted to the next failed address register 411.

The last failed address register 411 in queue 208 is preferably composed of shift registers 403 and 405. When an error detection cycle is complete, self-test circuitry 214 clocks the shift registers to output the stored failed addresses to an external test device on a bit by bit basis. When all bits in shift registers 403 and 405 have been output, self-test circuitry 214 generates an "artificial" error detect signal, thereby moving the next stored failed address into shift registers 403 and 405. The failed address is then serially clocked out to the external testing unit.

The external testing unit may, for example, store the failed addresses in a database searchable by a unique DRAM ID code. The failed addresses may be repaired by known DRAM repair techniques, such as replacing failed addresses with redundant rows/columns using laser or electrical fuses.

Depending on the specific configuration of the DRAM, failed address queue 208 may include as few as two or three failed address registers 411, or, on the other end of the scale, the number may reach into the thousands. The required number is preferably based upon a statistical analysis of DRAM fail rate balanced against the cost of adding additional registers.

Figure 5:
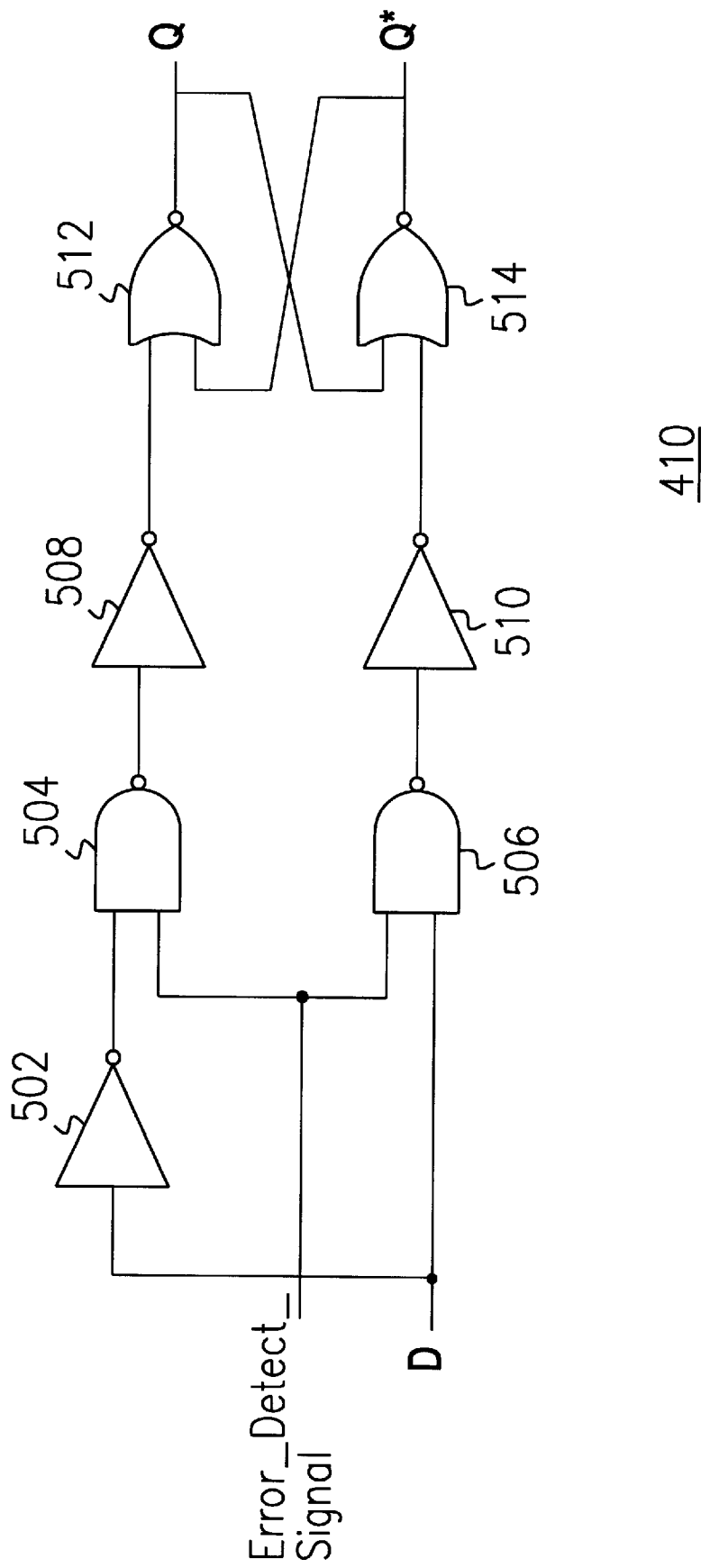
FIG. 5 is a circuit diagram of the preferred implementation of a delay latch according to the present invention.

FIG. 5 is a circuit diagram of a preferred implementation of delay latch 410, used to implement failed address registers 411. Delay latch 410 includes an inverter 502, whose output is received by one of two NAND gates 504 and 506. The output of NAND gates 504 and 506 are input to inverters 508 and 510, respectively, the outputs of which in turn are applied as respective inputs to cross-coupled NOR gates 512 and 514. In operation, a high value pulse input on error detect signal line causes the signal present at input D to propagate through the delay latch to output Q. Once a stable result is present at output Q, it is held there until the error detect signal is again activated.

DRAM WITH SELF-TEST AND REDUNDANT ROW/COLUMN SELF-REPAIR

Figure 6:
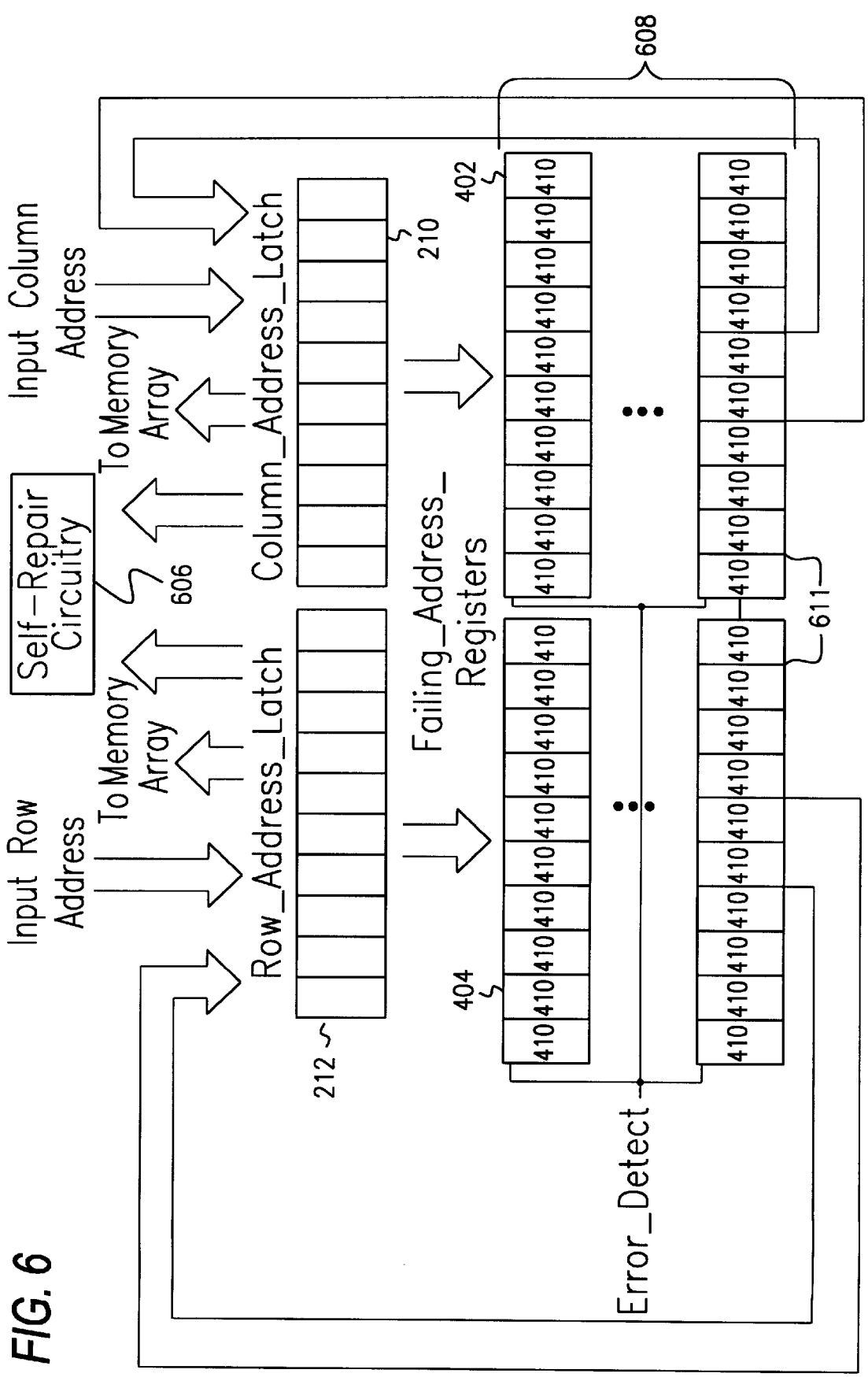
FIG. 6 is a diagram illustrating a second embodiment of a failed cell address queue according to the present invention.

FIG. 6 is a diagram illustrating a second embodiment of failed address queue, indicated by 608. In this embodiment, the failed address queue interacts directly with self-repair circuitry within the DRAM.

Failed address queue 608 is constructed similarly to the failed address queue 208 of FIG. 4. The difference is that instead of using shift registers for the last failed address register, the last failed address queue 608 is comprised of delay latches 410 coupled to feed their outputs back into row address latch 212 and column address latch 210.

When the failed addresses have been stored in failed address queue 608, self-test circuitry 214 initiates a self-repair sequence by enabling self-repair circuitry 606 and by clocking the failed addresses stored in failed address register 611 to column address latch 210 and row address latch 212. As the successive failed addresses are written into row address latch 212 and column address latch 210, self-repair circuitry 606 reads the failed addresses and replaces them with redundant rows and/or columns by blowing electrical fuses on the DRAM.

DRAM WITH SELF-TEST AND PARTIALING

Occasionally, the number of failed rows/columns exceeds the number of available redundant rows/columns. In this situation, it is impossible to repair the DRAM to its intended capacity. Some portion of the DRAM can still be salvaged, however, if the failed addresses occur in a range that may be disabled. For example, if the test circuitry determines that all failing bits occur when the first row address bit is logic one, the first row address bit may be forced to always maintain a logic zero. Forcing an address bit to a single logic state is called partialing. In this example, partialing reduced the available addressable memory cells by one-half, but a DRAM with half its intended memory capacity is more useful than an unsalvageable one.

Figure 7:
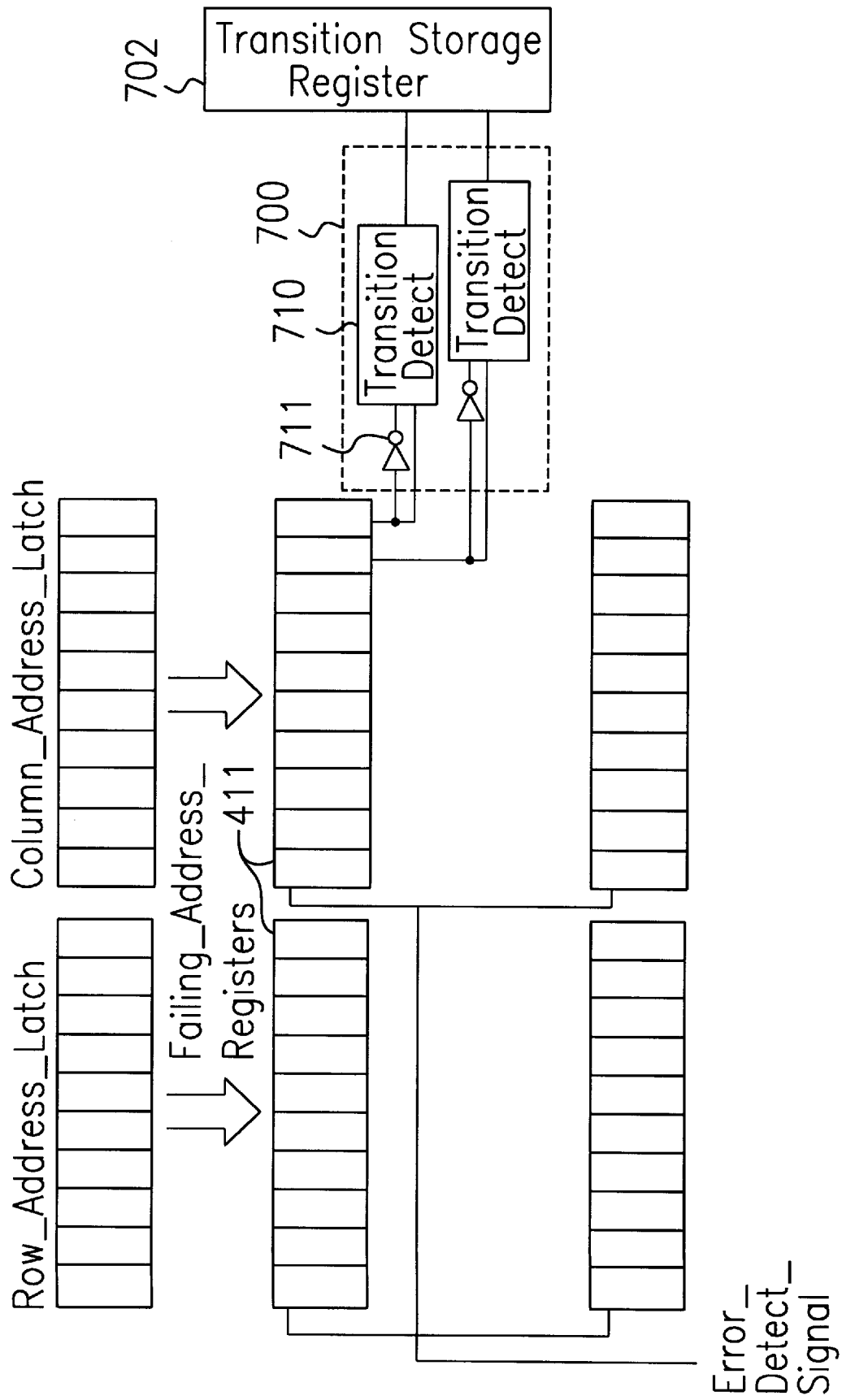
FIG. 7 is a diagram illustrating a third embodiment of a failed address queue according to the present invention.
Figure 8:
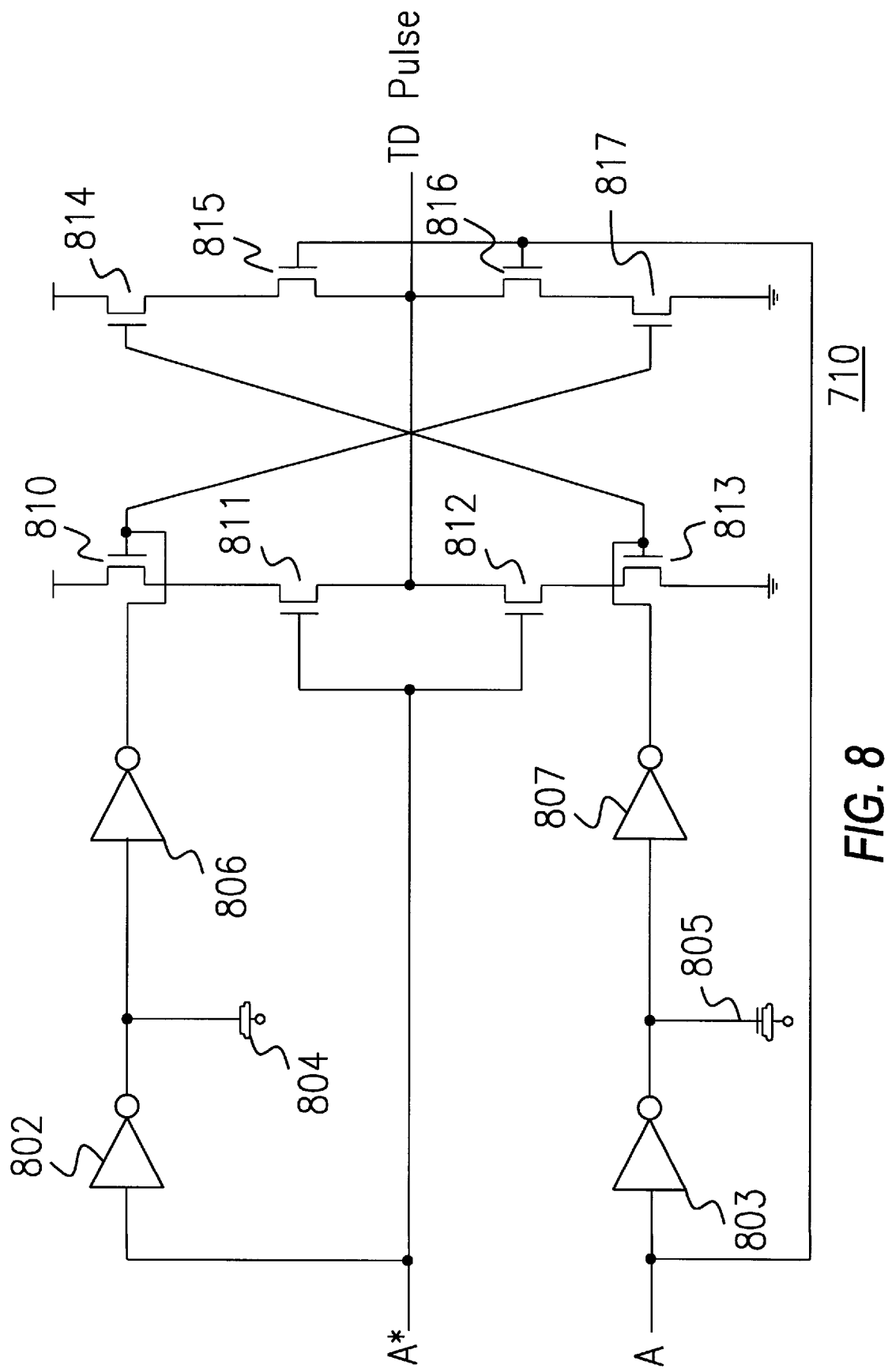
FIG. 8 is a circuit diagram of the preferred implementation of transition detect circuitry according to the present invention.

FIGS. 7 and 8 illustrate an embodiment of a failed address queue according to the present invention for detecting failed address ranges. This embodiment stores failed addresses identically to the embodiment shown in FIG. 4. However, this embodiment also includes transition detect circuitry 700, for receiving each bit of each failed address from the first failing address register 411, and transition detect storage register 702, for monitoring and storing signals from transition detect circuitry 700.

Transition detect circuitry 700 includes transition detection logic 710 and an inverter 711. Preferably, each bit in failed addresses register 411 is connected to one of transition logic 710 and inverter 711, although only the first two bit stages of failed address register 411 are shown so connected in FIG. 7.

In operation, each output bit and its complement from failed address register 411 is received by transition logic 710. If transition logic 710 detects a transition or a change either from a logic one to a logic zero, or from a logic zero to a logic one, it pulses low its normally high state. The low pulse is detected by transition storage register 702, which stores an indication that a pulse was received. At the end of a testing cycle, self-test circuitry 214 analyzes the results held in transition storage register 702. If the results indicate that one of the address bits has the same logical value for all the failed addresses (i.e., transition storage register 702 did not receive a pulse), that address bit is determined to be eligible for partialing.

FIG. 8 is a circuit diagram of an exemplary embodiment of transition logic circuit 710 in FIG. 7. Transition logic 710 includes a pair of input inverters 802 and 803, whose outputs are connected to ground through capacitors 804 and 805 and also as inputs to a second pair of inverters 806 and 807, respectively. The outputs of inverters 806 and 807 are connected to FETs 810 and 813, respectively. FETs 811, 812, 814, 815, 816, and 817, are connected as shown to complete the transition logic. The node of a output transition detect (TD) pulse is connected to the node shared by FETs 811, 812, 815 and 816. Data A* input is applied to the input of inverter 802 and to the gates of FETs 811 and 812, while Data A input is applied to the input of inverter 803 and the gates of FETs 815 and 816.

In operation, capacitors 804 and 805 delay the inputs A and A*, which control FETs 810, 814, 813, and 817. A and A*, however, are applied directly to control FETs 811, 812, 815, and 816. When the inputs change state, the non-delayed signals control FETs 811, 812, 815, and 816, causing the output TD to change state. After a delay, the inputs are supplied to the gates of FETs 810, 814, 813, and 817, forcing output TD back to its original state. In this manner, a negative output pulse proportional in duration to the capacitance of the capacitors 804 and 805 is created.

SELF-TEST DRAM WITH REDUCED STORAGE REQUIREMENTS

In some instances, the number of available storage spaces in the failed address queue may not be enough to handle all of the failed addresses.

Figure 9A:
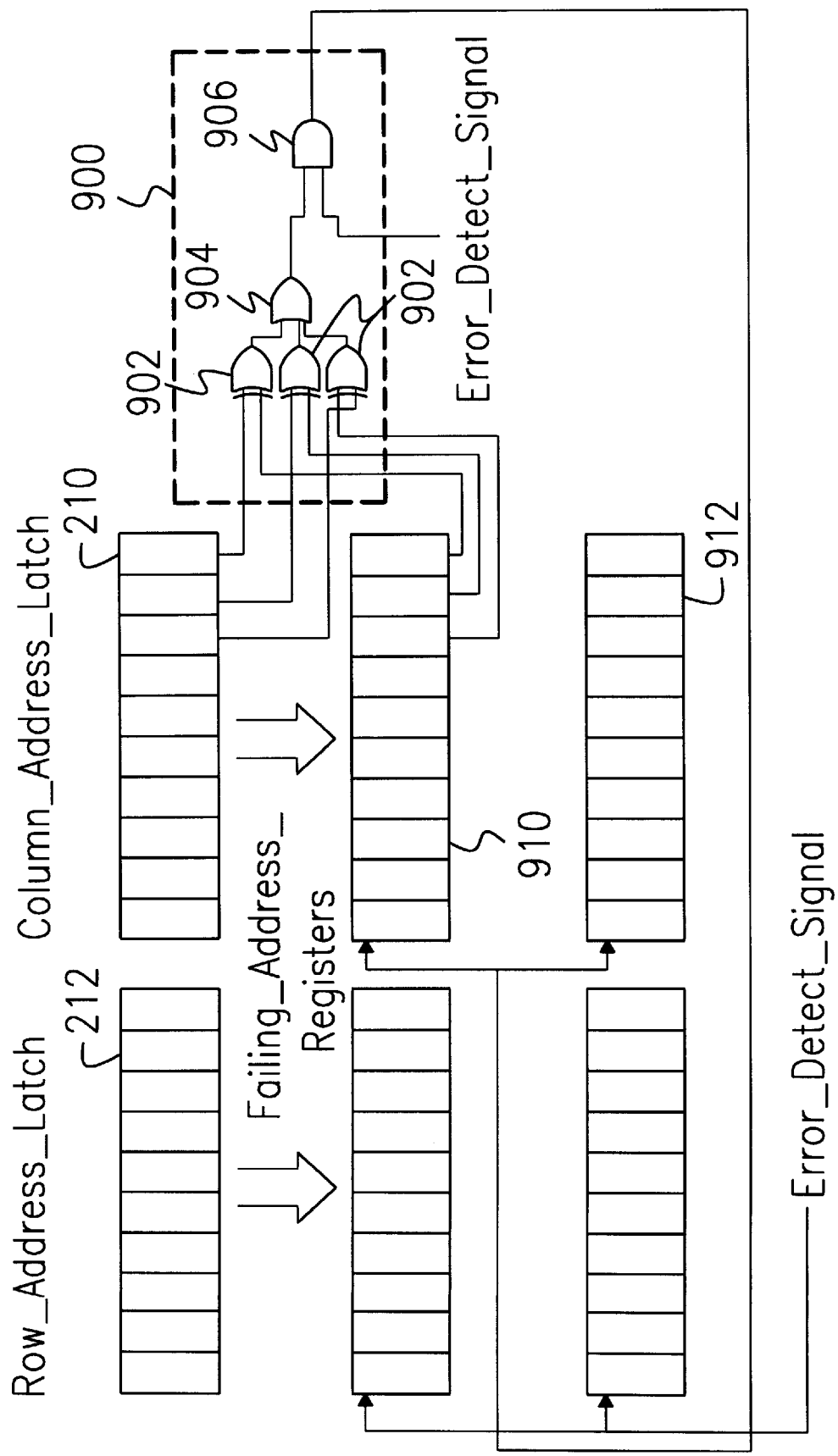
FIGS. 9A and 9B are diagrams illustrating additional embodiments of a failed cell address queue according to the present invention.

FIG. 9A illustrates an embodiment of a failed address queue according to the present invention for storing failed addresses in a compressed form. In this embodiment, address change detection circuitry 900 detects whether a new failed address in column address latch 210 is the same as the failed address previously stored in the column failing address register 910. If the addresses are not the same, the error detect signal pulse is passed through AND gate 906, causing the new failed address to be written into register 910 and the previously stored failed address to be written into register 912. In this manner, identical failing column addresses are not redundantly stored in the failing address registers.

Address change detection circuitry 900 includes a series of XOR gates 902, each having one input connected to the output of column address latch 210 and the other input connected to the output of register 910. For simplicity, only three XOR gates are shown in FIG. 9, although there would actually be one XOR gate for each bit in the column address. If there is a difference in one of the XOR gate inputs, a logic one is propagated through OR gate 904, thus enabling AND gate 906 to pass the error detect signal EDS. If all the XOR gates have identical inputs, a logic zero is propagated through OR gate 904, thus disabling the error detect signal EDS from advancing the failed column addresses from the failed column address register 910 to the failed column address register 912.

The embodiment of the failed address queue shown in FIG. 9A only stores identical failing column addresses that occur adjacent to one another. That is, if a first failing column address X is separated from a second failing column address X by a third failing column address Y, column address X would be stored twice because the intermediate column address Y would effectively clear the memory of address change detection circuitry 900. If one desires to exclude failed non-adjacent addresses from storage, additional circuitry could be used to cycle the previously stored addresses through register 910 for each failing address detected in latch 910.

Figure 9B:
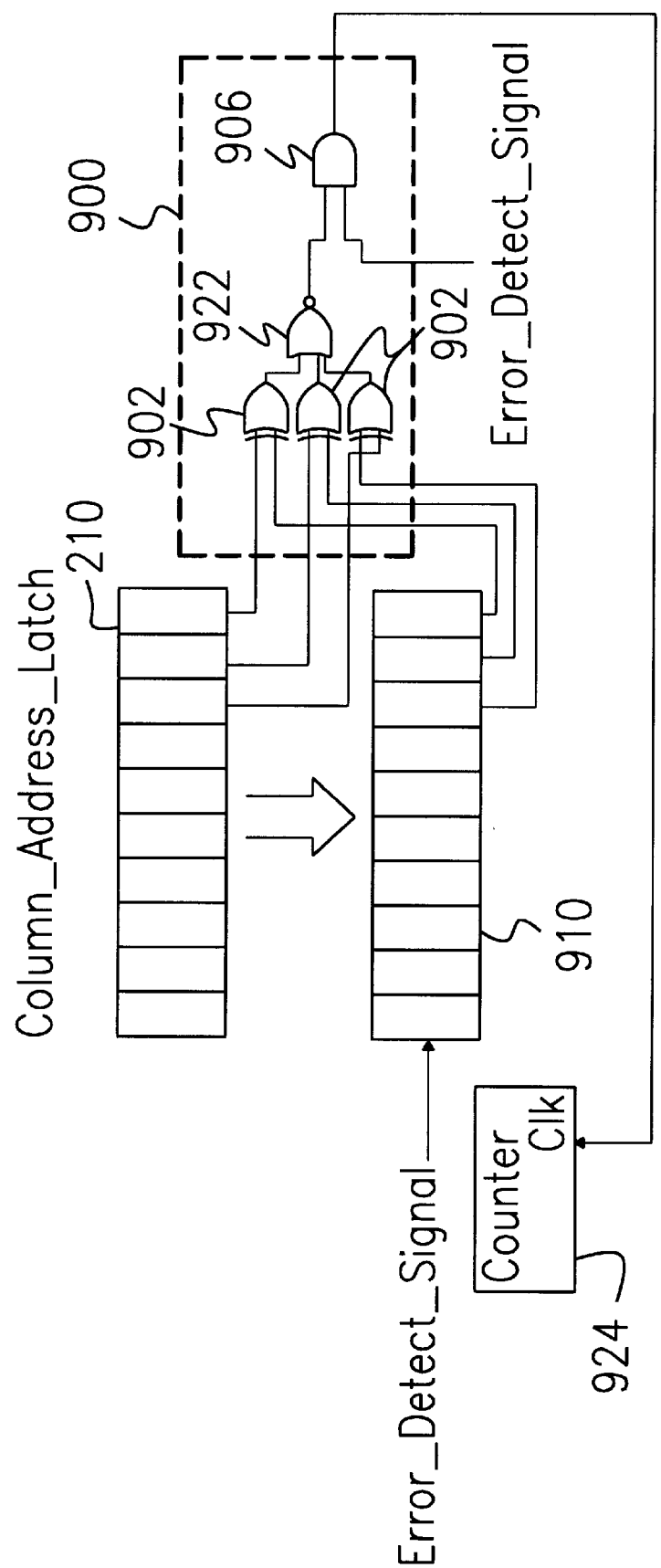

FIG. 9B illustrates an alternate embodiment of a failed address queue according to the present invention for storing failed addresses in a compressed form. In this embodiment, address change detection circuitry 920 is similar to address change detection circuitry 900 except that OR gate 904 is replaced with NOR gate 922. Address detection circuitry 920 detects whether a new failed address in column address latch 210 is the same address previously stored in the column failing address register 910. If the addresses are the same, the EDS signal passes through AND gate 906, incrementing counter 924. In this manner, the number of identical failing column addresses can be saved without independently storing each failing address in a separate register. If multiple fails are detected at the same column address, the column is given a high priority for replacement with a redundant column (i.e., the column is called a "must" repair column).

Although a column address is shown as the detected address in FIG. 9B, row addresses could equivalently be detected. Indeed, multiple row addresses and/or columns may simultaneously be detected using multiple failing address registers 910 and multiple corresponding address change detection circuits 920. Additionally, although a general counter is shown in FIG. 9B, the counter may be as simple as a single bit storage element. In this case, flipping the storage bit signifies that at least two fails of the same address have been detected, and the failed address should be considered a "must" repair.

It will be apparent to those skilled in the art that various modifications and variations can be made to the present invention without departing from the scope or spirit of the invention. For example, although above embodiments were all described with reference to a DRAM, the concepts disclosed herein could also be applied to testing of semiconductor memories such as static random access memories (SRAM) or Flash memories. The concepts of the invention may also be applied to non-semiconductor memories as well.

Other embodiments of the invention will be apparent to those skilled in the art from consideration of the specification and practice of the invention disclosed herein. The specification and examples are exemplary only. The true scope and spirit of the invention is instead indicated by the following claims and their equivalents.

What is claimed is:

1. A memory fabricated on a semiconductor chip, comprising:
   a memory array;
   a failed address queue which stores at least a memory array address in response to an error detection signal; and
   an error detection circuit including logic circuitry connected to receive a plurality of bits read from an addressed portion of the memory array and to transmit an error detection signal to the failed address queue when logical values of the plurality of bits are not alike.

2. The memory of claim 1, wherein the failed address queue comprises:
   a plurality of registers storing memory array addresses indicated by the error detection signal as addressing bits of unlike logical values, the stored addresses being advanced through the failed address queue synchronously with the error detection signal.

3. The memory of claim 2, wherein the plurality of registers in the failed address queue are organized in a first-in-first-out (FIFO) queue.

4. The memory of claim 3, wherein each of the plurality of registers in the FIFO except a last register in the FIFO queue comprise a series of delay latches, and wherein the last register in the FIFO queue is a shift register.

5. The memory of claim 2, further comprising:
   a row address latch and a column address latch for storing row and column addresses to access the addressed memory array location, the row address latch and column address latch being coupled to a first of the plurality of registers in the failed address queue;
   wherein a last register in the failed address queue transfers stored row and column addresses to the row and column address latches.

6. The memory of claim 2, further comprising:
   a plurality of transition detection circuits each coupled to a different address bit stage of a first of the plurality of registers, the transition detection circuits configured to detect when the address bits change state.

7. The memory of claim 1, wherein the logic detection circuitry of the error detection circuit comprises:
   first and second data compress circuits each arranged to receive a portion of the plurality of bits and to generate first and second sets of output signals, respectively, in response thereto;
   a third data compress circuit for receiving the sets of output signals from the first and second data compress circuits and generating a third set of output signals in response thereto; and
   a logic gate coupled to receive the third set of output signals and generate the error detection signal.

8. The memory of claim 7, wherein said logic gate includes a NOR gate.

9. The memory of claim 6, wherein the transition detection circuits each further comprise logic to output a pulse when the address bits change state.

10. An on-chip failing address storage system for a computer memory manufactured on a semiconductor chip, comprising:
    a failed address queue including a plurality of registers organized into a first-in-first-out (FIFO) queue, the plurality of registers storing memory array addresses in response to an error detection signal, the stored addresses being advanced through the FIFO queue synchronously with the error detection signal; and
    circuitry for transferring the stored address in the shift register to a device external to the semiconductor chip.

11. The storage system of claim 10, further comprising:
    an error detection circuit including logic circuitry connected to receive a plurality of bits from an addressed portion of a memory array and to generate and transmit the error detection signal to the failed address queue when logical values of the plurality of bits are not alike.

12. The storage system of claim 10, wherein each of the plurality of registers of the FIFO queue except a last register in the FIFO queue comprise a series of delay latches, and the last register in the FIFO queue is a shift register.

13. An on-chip failing address storage system for a computer memory manufactured on a semiconductor chip, comprising:
    a failed address queue including a plurality of registers organized into a first-in-first-out (FIFO) queue, the plurality of registers storing memory array addresses in response to an error detection signal, the stored addresses being advanced through the FIFO queue synchronously with the error detection signal; and
    a row address latch and a column address latch for storing row and column addresses used to access the memory, the row address latch and column address latch being coupled to a first of the plurality of registers in the FIFO queue and another one of the plurality of registers in the FIFO queue.

14. The storage system of claim 13, further comprising:
    an error detection circuit including logic circuitry connected to receive a plurality of bits from an addressed portion of a memory array and to generate and transmit the error detection signal to the failed address queue when logical values of the plurality of bits are not alike.

15. The storage system of claim 13, wherein the another one of the plurality of registers is a last one of the plurality of registers in the FIFO queue.

16. An integrated circuit memory, comprising:

a memory array including a plurality of memory cells;

a failed address queue which stores at least a memory array address in response to an error detection signal;

an error detection circuit including logic circuitry connected to receive a plurality of bits read from addressed cells of the memory array and to transmit an error detection signal to the failed address queue when logical values of the plurality of bits are not alike;

a self-repair circuit for repairing selected ones of said plurality of memory cells in response to the transmission of the error detection signal; and a row address latch and a column address latch for storing row and column addresses, the row address latch and column address latch being coupled to the memory array, the failed address queue, and the self-repair circuitry.

17. An integrated circuit memory, comprising:

a memory array;

an error detection circuit including logic circuitry connected to receive a plurality of bits read from an addressed cells of the memory array and to transmit an error detection signal when logical values of the plurality of bits are not alike;

an address latch coupled to the memory array and configured to store addresses to be used to access the memory array;

a failed address queue having at least one set of registers, each of the at least one set of registers storing memory array addresses in response to the error detection signal; and address change detection circuitry configured to receive a plurality of bits from the address latch and a corresponding plurality of bits from a first register in the failed address queue, and further configured to disable the error detection signal from reaching the first register when each of the plurality of bits in the address latch and the first register are alike, thereby preventing the first register from storing new memory array addresses.

18. The memory of claim 17, wherein the first register is a column address register of the failed address queue.

19. The memory of claim 17, wherein the first register is a row address register of the failed address queue.

20. The memory of claim 17, wherein the address change detection circuitry comprises a first set of logic gates configured to detect a difference between any one of corresponding bits of the address latch and the first register, and a second logic gate configured to disable the error detection signal when the first set of logic gates fails to detect the difference.

21. An integrated circuit memory, comprising:

a memory array including a plurality of memory cells;

an error detection circuit including logic circuitry connected to receive a plurality of bits read from the memory array and to transmit an error detection signal when logical values of the plurality of bits are not alike;

an address latch coupled to the memory array and configured to store addresses to be used to access the memory array;

a failed address queue having at least one set of registers, each of the at least one set of registers storing memory array addresses of defective ones of said plurality of memory cells in response to said error detecting signal;

a counter;

address change detection circuitry configured to receive a plurality of bits from the address latch and a corresponding plurality of bits from a first register in the failed address queue, and further configured to drive the counter when each of the plurality of bits in the address latch and the first register are alike.

22. The memory of claim 21, wherein the first register is a column address register of the failed address queue.

23. The memory of claim 21, wherein the first register is a row address register of the failed address queue.

24. The memory of claim 21, wherein the address change detection circuitry comprises a first set of logic gates configured to detect a difference between any one of corresponding bits of the address latch and the first register, and a second logic gate configured to disable the error detection signal when the first set of logic gates fails to detect the difference.

25. A computer system comprising:

a processor; and a dynamic random access memory (DRAM) fabricated on a semiconductor chip communicating with said processor and comprising:

a memory array;

a failed address queue which stores at least a memory array address in response to an error detection signal; and an error detection circuit including logic circuitry connected to receive a plurality of bits read from an addressed portion of the memory array and to transmit an error detection signal to the failed address queue when logical values of the plurality of bits are not alike.

26. The computer system of claim 25, wherein the failed address queue comprises:

a plurality of registers organized into a first-in-first-out (FIFO) queue, the plurality of registers storing memory array addresses indicated by the error detection signal as addressing bits of unlike logical values, the stored addresses being advanced through the FIFO queue synchronously with the error detection signal.

27. The computer system of claim 26, wherein each of the plurality of registers except a last register in the FIFO queue comprise a series of delay latches, and wherein the last register in the FIFO queue is a shift register.

28. The computer system of claim 26, further comprising:

a row address latch and a column address latch for storing row and column addresses to access the addressed memory array location, the row address latch and column address latch being coupled to a first of the plurality of registers in the FIFO queue;

wherein a last register in the FIFO queue transfers stored row and column addresses to the row and column address latches.

29. The computer system of claim 26, further comprising:

a plurality of transition detection circuits each coupled to a different address bit stage of a first of the plurality of registers, the transition detection circuits configured to detect when the address bits change state.

30. A method of testing memory arrays, comprising the steps of:

accessing the memory array using row and column addresses;

reading out a plurality of bits from the accessed memory array;

generating an error detection signal when logical values of the received plurality of bits are not alike;

storing the row address and column addresses of the addressed memory array location in response to the error detection signal.

31. A method of testing memory arrays, comprising the steps of:

accessing the memory array using row and column addresses;

reading out a plurality of bits from the accessed memory array;

generating an error detection signal when logical values of the received plurality of bits are not alike;

storing the number of error detection signals generated.

* * * * *

UNITED STATES PATENT AND TRADEMARK OFFICE
CERTIFICATE OF CORRECTION

PATENT NO : 5,910,921

DATED : June 8, 1999

INVENTOR(S): Beffa et al.

It is certified that error appears in the above-identified patent and that said Letters Patent is hereby corrected as shown below:

COLUMN 5:
Line 42, cancel "2", substitute --302--.

COLUMN 9:
Claim 1, line 5, insert--, said stored memory array address being accessible by an external device-- after "signal".

COLUMN 10:
Claim 10, line 10, cancel "the shift"; and line 11, cancel "register", substitute--a last register within the FIFO queue--.

Claim 13, line 15, insert--, wherein the another one of the plurality of registers in the FIFO queue transfers stored row and column addresses to the row address latch and column address latch-- after "queue".

COLUMN 11:
Claim 16, line 17, insert--, the row address latch and the column address latch receiving stored memory array addresses from the failed address queue and sending them to the self-repair circuitry so that the memory cells corresponding to the row and column addresses may be repaired--after "circuitry".

COLUMN 12:
Claim 25, line 8, insert--, said stored memory array address being accessible by an external device-- after "signal".

COLUMN 13:
Claim 30, line 8, insert --and-- after ";"; and
line 10, insert--into a failed address queue being accessible by an external device--after "location".

UNITED STATES PATENT AND TRADEMARK OFFICE
CERTIFICATE OF CORRECTION

PATENT NO. : 5,910,921
DATED : June 8, 1999
INVENTOR(S) : Beffa et al.

It is certified that error appears in the above-identified patent and that said Letters Patent is hereby corrected as shown below:

COLUMN 14:
Claim 31, line 8, insert --and-- after ";"; and
line 9, insert --into a failed address queue being accessible by an external deivce-- after "generated".

Signed and Sealed this

Seventh Day of March, 2000

Q. TODD DICKINSON

Attest:

Attesting Officer

Commissioner of Patents and Trademarks